(12) United States Patent  
Seidel et al.

(10) Patent No.: US 8,048,796 B2  
(45) Date of Patent: Nov. 1, 2011

(54) MICROSTRUCTURE DEVICE INCLUDING A METALLIZATION STRUCTURE WITH SELF-ALIGNED AIR GAPS FORMED BASED ON A SACRIFICIAL MATERIAL

(75) Inventors: Robert Seidel, Dresden (DE); Thomas Werner, Moritzburg (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/786,019

(22) Filed: May 24, 2010

(65) Prior Publication Data

US 2010/0301489 A1 Dec. 2, 2010

(30) Foreign Application Priority Data

May 29, 2009 (DE) .......................... 10 2009 023 377

(51) Int. Cl.
*H01L 21/4763* (2006.01)
(52) U.S. Cl. ...................................................... 438/618
(58) Field of Classification Search .................... None
See application file for complete search history.

(56) References Cited

U.S. PATENT DOCUMENTS

| | | | |
|---|---|---|---|
| 5,869,379 A | 2/1999 | Gardner et al. | 438/305 |
| 5,949,143 A | 9/1999 | Bang | 257/758 |
| 5,953,625 A | 9/1999 | Bang | 438/619 |
| 6,160,316 A | 12/2000 | Gardner et al. | 257/773 |
| 6,376,330 B1 | 4/2002 | Fulford, Jr. et al. | 438/421 |
| 6,713,835 B1* | 3/2004 | Horak et al. | 257/522 |
| 7,026,235 B1 | 4/2006 | Ben-Tzur et al. | 438/619 |
| 2002/0158337 A1* | 10/2002 | Babich et al. | 257/758 |
| 2004/0232552 A1 | 11/2004 | Wang et al. | 257/758 |
| 2005/0037604 A1* | 2/2005 | Babich et al. | 438/619 |
| 2007/0259516 A1* | 11/2007 | Jahnes et al. | 438/618 |
| 2008/0073748 A1* | 3/2008 | Bielefeld et al. | 257/522 |
| 2008/0124917 A1* | 5/2008 | Oh et al. | 438/637 |
| 2008/0169542 A1* | 7/2008 | Suzuki et al. | 257/684 |

FOREIGN PATENT DOCUMENTS

DE 112007002215 T5 7/2009
DE 102008044984 A1 7/2010

OTHER PUBLICATIONS

Translation of Official Communication from German Patent Office for German Patent Application No. 10 2009 023 377.6 dated Oct. 5, 2010.

\* cited by examiner

*Primary Examiner* — Charles Garber
*Assistant Examiner* — Andre' C Stevenson
(74) *Attorney, Agent, or Firm* — Williams, Morgan & Amerson, P.C.

(57) ABSTRACT

In a sophisticated metallization system of a semiconductor device, air gaps may be formed in a self-aligned manner on the basis of a sacrificial material, such as a carbon material, which is deposited after the patterning of a dielectric material for forming therein a via opening. Consequently, superior process conditions during the patterning of the via opening and the sacrificial material in combination with a high degree of flexibility in selecting appropriate materials for the dielectric layer and the sacrificial layer may provide superior uniformity and device characteristics.

16 Claims, 11 Drawing Sheets

MICROSTRUCTURE DEVICE INCLUDING A METALLIZATION STRUCTURE WITH SELF-ALIGNED AIR GAPS FORMED BASED ON A SACRIFICIAL MATERIAL

BACKGROUND OF THE INVENTION

1. Field of the Invention

Generally, the present disclosure relates to microstructure devices, such as integrated circuits, and, more particularly, to the metallization layers including highly conductive metals, such as copper, and dielectric materials including air gaps.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

In integrated circuits having minimum dimensions of approximately 0.35 μm and less, a limiting factor of device performance is the signal propagation delay caused by the switching speed of the transistor elements. As the channel length of these transistor elements has now reached 50 nm and less, the signal propagation delay is no longer limited by the field effect transistors but is limited, owing to the increased circuit density, by the interconnect lines, since the line-to-line capacitance (C) is increased and also the resistance (R) of the lines is increased due to their reduced cross-sectional area. The parasitic RC time constants and the capacitive coupling between neighboring metal lines, therefore, require the introduction of a new type of material for forming the metallization layer.

Traditionally, metallization layers, i.e., the wiring layers including metal lines and vias for providing the electrical connection of the circuit elements according to a specified circuit layout, are formed by a dielectric layer stack including, for example, silicon dioxide and/or silicon nitride, with aluminum as the typical metal. Since aluminum suffers from significant electromigration at higher current densities that may be necessary in integrated circuits having extremely scaled feature sizes, aluminum is being replaced by, for instance, copper, which has a significantly lower electrical resistance and a higher resistivity against electromigration. For highly sophisticated applications, in addition to using copper and/or copper alloys, the well-established and well-known dielectric materials silicon dioxide (k≈4.2) and silicon nitride (k>7) may increasingly be replaced by so-called low-k dielectric materials having a relative permittivity of approximately 3.0 and less. However, the transition from the well-known and well-established aluminum/silicon dioxide metallization layer to a copper-based metallization layer possibly in combination with a low-k dielectric material is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines and vias. Typically, in the damascene technique, the dielectric layer is deposited and then patterned for receiving trenches and via openings that are subsequently filled with copper or alloys thereof by plating methods, such as electroplating or electroless plating. Moreover, since copper readily diffuses in a plurality of dielectrics, such as silicon dioxide and in many low-k dielectrics, the formation of a diffusion barrier layer at interfaces with the neighboring dielectric material may be required. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration.

During the filling in of a conductive material, such as copper, into the trenches and via openings, a significant degree of overfill has to be provided in order to reliably fill the corresponding openings from bottom to top without voids and other deposition-related irregularities. Consequently, after the metal deposition process, excess material may have to be removed and the resulting surface topography is to be planarized, for instance, by using electrochemical etch techniques, chemical mechanical polishing (CMP) and the like. For example, during CMP processes, a significant degree of mechanical stress may be applied to the metallization levels formed so far, which may cause structural damage to a certain degree, in particular when sophisticated dielectric materials of reduced permittivity are used. As previously explained, the capacitive coupling between neighboring metal lines may have a significant influence on the overall performance of the semiconductor device, in particular in metallization levels, which are substantially "capacitance driven," i.e., in which a plurality of closely spaced metal lines have to be provided in accordance with device requirements, thereby possibly causing signal propagation delay and signal interference between neighboring metal lines. For this reason, so-called low-k dielectric materials or ultra low-k materials may be used, which may provide a dielectric constant of 3.0 and significantly less in order to enhance the overall electrical performance of the metallization levels. On the other hand, typically, a reduced permittivity of the dielectric material is associated with a reduced mechanical stability, which may require sophisticated patterning regimes so as to not unduly deteriorate reliability of the metallization system.

The continuous reduction of the feature sizes, however, with gate lengths of approximately 40 nm and less, may demand for even more reduced dielectric constants of the corresponding dielectric materials, which may increasingly contribute to yield loss due to, for instance, insufficient mechanical stability of respective ultra low-k materials. For this reason, it has been proposed to introduce "air gaps," at least at critical device areas, since air or similar gases may have a dielectric constant of approximately 1.0, thereby providing reduced overall permittivity, while nevertheless allowing the usage of less critical dielectric materials. Hence, by introducing appropriately positioned air gaps, the overall permittivity may be reduced while, nevertheless, the mechanical stability of the dielectric material may be superior compared to conventional ultra low-k dielectrics. For example, it has been proposed to introduce nano holes into appropriate dielectric materials, which may be randomly distributed in the dielectric material so as to significantly reduce the density of the dielectric material. However, the creation and distribution of the respective nano holes may require a plurality of sophisticated process steps for creating the holes with a desired density, while at the same time the overall characteristics of the dielectric material may be changed in view of the further processing, for instance with respect to planarizing surface areas, depositing further materials and the like.

In other approaches, advanced lithography processes are additionally introduced so as to create appropriate etch masks for forming gaps near respective metal lines with a position and size as defined by the lithographically formed etch mask. In this case, however, additional cost intensive lithography steps may be required, wherein also the positioning and the dimensioning of the corresponding air gaps may be restricted by the capabilities of the respective lithography processes. Since, typically, in critical metallization levels, the lateral dimensions of metal lines and the spacing between adjacent metal lines may be defined by critical lithography steps, an appropriate and reliable manufacturing sequence for providing intermediate air gaps may be difficult to be achieved on the basis of the available lithography techniques.

In other conventional approaches, the dielectric material of the metallization layer under consideration may be etched selectively with respect to the metal lines down to a specified depth, thereby avoiding complex lithography steps for positioning the air gaps between the metal lines. Consequently, a self-aligned technique may be accomplished by using the etch selectivity between the metal lines and the low-k dielectric material. In other cases, at least a portion of the dielectric material may be formed by using an appropriate material composition, which may allow an efficient removal, for instance, on the basis of well-established etch recipes and the like. In this case, the metal lines may be formed in the sacrificial dielectric material which may then be efficiently removed so as to obtain corresponding recesses, which may subsequently be capped by depositing a dielectric material. Consequently, the latter approaches may provide self-aligned process strategies by removing at least a portion of the dielectric material down to a specified depth on the basis of etch techniques without requiring critical lithography processes. Although these approaches are very promising and may result in a cost-efficient production sequence, there are still significant drawbacks associated with the patterning of vias and the trenches in the layer stack comprising the low-k material and the sacrificial material, in particular for device generations including transistors of critical dimensions of approximately 40 nm and less.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which air gaps may be positioned between metal regions in a self-aligned manner on the basis of a sacrificial fill material, such as a dielectric material or a conductive material, wherein significant advantages with respect to patterning via openings and metal regions may be accomplished by forming a via opening connecting to a lower lying metallization level or to a contact structure of circuit elements, prior to patterning the sacrificial fill material. Consequently, the via opening formed in an appropriate dielectric material, such as a material providing etch stop capabilities, possibly in combination with copper confining characteristics, may be formed with a high degree of process efficiency due to less demanding process conditions during the patterning sequence. Similarly, the trenches to be formed in the sacrificial fill material, which may be applied after forming the via opening, may also be formed on the basis of enhanced process conditions compared to conventional strategies, thereby enabling further device scaling without compromising overall performance of the metallization system while, additionally, a high degree of flexibility in configuring the metallization system may be accomplished.

One illustrative method disclosed herein comprises forming a via opening in a dielectric layer of a metallization layer of a semiconductor device. The method further comprises forming a sacrificial material layer above the dielectric layer and forming a plurality of trenches in the sacrificial material layer, wherein one of the plurality of trenches connects to the via opening. The method additionally comprises forming metal regions on the basis of the plurality of trenches and removing the sacrificial material layer from between at least some of the metal regions. Moreover, the method comprises depositing a dielectric cap layer so as to form air gaps between the at least some of the metal regions.

A further illustrative method disclosed herein comprises forming a sacrificial material above a dielectric material of a metallization system of a microstructure device and within a via opening formed in the dielectric material. The method further comprises forming a plurality of metal regions in the sacrificial material, wherein one of the plurality of metal regions is formed in and above the via opening. Additionally, the method comprises removing the sacrificial material at least from between two adjacent metal regions of the plurality of metal regions by using the dielectric material as an etch stop material. Additionally, the method comprises forming a dielectric cap layer above the plurality of metal regions so as to form a gap at least between the two adjacent metal regions.

One illustrative microstructure device disclosed herein comprises a plurality of metal regions formed in a metallization layer. The microstructure device further comprises a via formed in a dielectric material of the metallization layer, wherein one of the plurality of metal regions connects to the via. Additionally, an air gap is located between a pair of neighboring metal regions of the plurality of metal regions. Additionally, a fill material is formed on the dielectric material in a device area that is laterally offset from the pair of neighboring metal regions. Finally, a dielectric cap material covers the air gap and the fill material.

BRIEF DESCRIPTION OF THE DRAWINGS

The disclosure may be understood by reference to the following description taken in conjunction with the accompanying drawings, in which like reference numerals identify like elements, and in which.

Figure 1A:
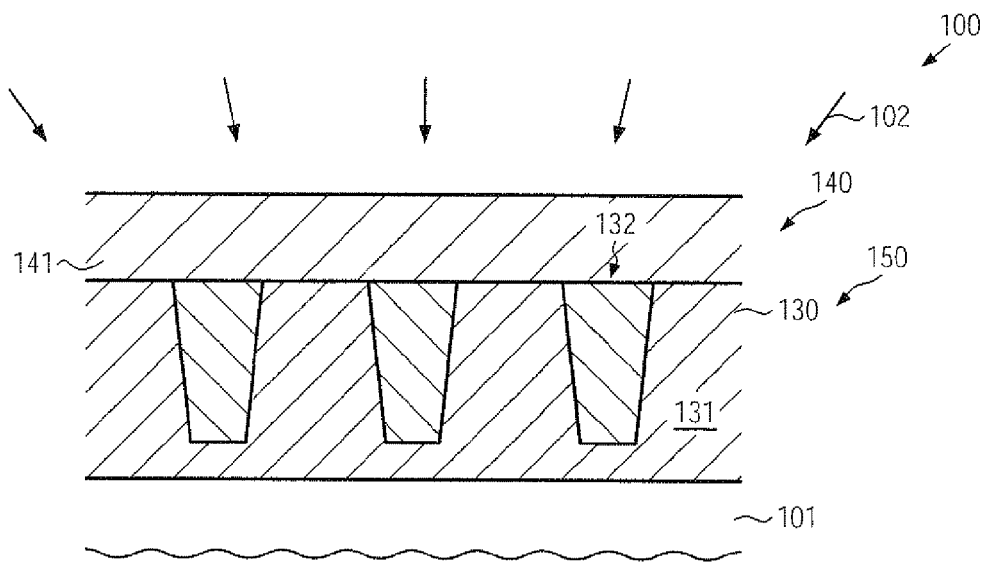
FIGS. 1a-1j schematically illustrate cross-sectional views of a semiconductor device during various manufacturing stages in forming a metallization layer with air gaps between closely spaced metal lines by using a sacrificial fill material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides techniques and microstructure devices, for instance integrated circuits, in which the electrical performance of a metallization system may be enhanced by providing air gaps between closely spaced metal regions on the basis of a self-aligned technique by using an appropriate sacrificial fill material which may, at least locally, be removed in a selective manner with respect to a dielectric material in which a via may be formed so as to connect to a lower lying metallization level or a contact structure of the semiconductor device. Consequently, a very efficient overall process strategy may be applied since at least the via opening, and in some illustrative embodiments also the via, may be formed separately in a dedicated dielectric material prior to depositing the sacrificial material, which may then also be patterned on the basis of superior process conditions. Furthermore, a high degree of flexibility may be accomplished by applying the above-specified process strategy, for instance with respect to selecting the dielectric material for forming the vias and the sacrificial material, which may, in some illustrative embodiments, be completely removed, while in other cases appropriate material characteristics of the sacrificial material may be taken advantage of, for instance, a superior heat conductivity, superior stop capabilities during a chemical mechanical polishing (CMP) process and the like, may be achieved by the sacrificial material. For example, in some illustrative embodiments, the sacrificial layer may be provided in the form of a carbon layer, such as an amorphous carbon, a diamond-like carbon and the like, thereby utilizing, among other things, the before-specified advantages. For example, by using a carbon material as the sacrificial material, which may be preserved in certain device areas, efficient heatsink configurations may be established, thereby providing superior heat dissipation capabilities, although wide areas of the metallization system may comprise air gaps for reducing the parasitic capacitance. In other cases, any appropriate material composition for the dielectric material and the sacrificial material may be selected so as to enhance the overall process sequence, for instance with respect to etch stop capabilities, copper confinement, if required, and the like. For example, in some illustrative embodiments, at least the vias may be formed in the dielectric material, which may additionally provide copper confinement, thereby providing a reduced complexity during the deposition of an appropriate metal, since a deposition of a conductive barrier material may be omitted or may be performed in view of enhanced electromigration behavior rather than requiring a reliable copper confinement. Furthermore, the materials may be selected such that improved conditions in the selective deposition of a conductive cap material may be achieved, thereby obtaining superior electromigration performance without increasing the probability of creating under-etched areas in corresponding via openings upon performing wet chemical cleaning processes prior to the deposition of the metal in the via and trench openings.

Since the present disclosure relates to techniques and devices which enable the positioning and dimensioning of air gaps in a self-aligned manner and, if desired, in a locally selective manner, the principles disclosed herein may be highly advantageously applied to sophisticated microstructure devices, such as integrated circuits including transistor elements of the 45 nm technology or the 22 nm technology and beyond. The principles disclosed herein, however, may also be applied to less critical microstructure devices, thereby enabling the usage of superior dielectric materials since corresponding air gaps may be provided at device areas requiring a low permittivity, which may be achieved even with "conventional" dielectric materials. Thus, the present disclosure should not be considered as being restricted to specific critical device dimensions unless such restrictions are explicitly set forth in the appended claims or in embodiments described in the specification.

FIG. 1a schematically illustrates a cross-sectional view of a microstructure device 100 which, in the present embodiment, may be represented by an integrated circuit including circuit elements, such as transistors, capacitors, resistors and the like. In this case, the device 100 may comprise a device level formed in and above a substrate 101 in which semiconductor-based circuit elements may be provided. For convenience, any such circuit elements are not shown in FIG. 1a. For example, as previously explained, transistor elements may be provided in the device level with critical dimensions of 50 nm and less, such as 30 nm and less, if sophisticated devices are considered. In other cases, in addition to or alternatively, the substrate 101 may include any appropriate microstructure features, such as micromechanical components, optoelectronic components and the like, wherein at least some of these components may require an interconnect structure formed in a metallization system 150. As discussed above, in highly complex integrated circuits, a very large number of electrical connections may be required and, thus, a plurality of metallization layers 130, 140 may typically be formed in the metallization system 150. For example, the metallization layers 130, 140 may represent two of a plurality of metallization layers of the system 150, each of which may connect to a lower lying metallization layer in accordance with the required overall circuit layout. In other cases, the layer 130 of the metallization system 150 may represent a contact structure which may include appropriate contact elements, for instance partially formed on the basis of a metal-containing material, in order to connect to semiconductor devices. In this case, the metallization layer 140 may be considered as the very first metallization layer, while the layer 130 may be considered as an interface connecting the metallization system 150 with the actual circuit elements formed in and above the substrate 101. The layer 130 may comprise a dielectric material 131, which may be provided in the form of any appropriate material, such as a low-k dielectric material, a dielectric material having a dielectric constant of approximately 3.0 or higher and the like. It should be appreciated that, in some illustrative embodiments (not shown), the layer 130 may have a similar configuration as the metallization layer 140, as will be described later on in more detail, so that also corresponding air gaps may be provided within the layer 130 if required. In other cases, the dielectric material 131 may represent the dielectric material of a contact structure which may thus comprise any appropriate interlayer dielectric material, possibly in combination with stress-inducing dielectric components, in order to enhance overall performance of corresponding transistor elements since typically a specifically designed strain component in transistors may increase charge carrier mobility and the like. The layer 130 may further comprise conductive regions 132, such as metal lines, contact elements and the like, depending on the overall configuration of the layer 130.

Moreover, in the manufacturing stage shown, the metallization layer 140 may comprise a dielectric material 141 that may be provided with a thickness that is appropriate for forming therein a via opening in a later manufacturing stage. The dielectric material 141 may be comprised of any appropriate material which may be compatible with the further processing of the device 100. In some illustrative embodiments, the dielectric material 141 may be comprised of a dielectric material providing etch stop capabilities with respect to a sacrificial material still to be deposited in a later manufacturing stage. For this purpose, well-established "conventional" dielectric materials may be used in the form of silicon nitride based materials, nitrogen-containing silicon carbide material and the like, which may provide high etch selectivity with respect to a plurality of materials typically used in a fabrication process for sophisticated semiconductor devices. Furthermore, the dielectric material 141 may have a diffusion blocking effect for a plurality of atomic species, such as copper atoms, which may be advantageous in view of confining respective metal species in the conductive regions 132. In other cases, the conductive regions 132, for instance provided in the form of copper-containing contact elements, metal lines and the like, may be confined by an appropriate conductive barrier material (not shown) in combination with a conductive cap material (not shown), if considered appropriate.

The microstructure device 100 as illustrated in FIG. 1a may be formed on the basis of the following processes. After forming any circuit elements in and above the substrate 101, the metallization system 150 may be formed, for instance, by first forming the layer 130, for instance in the form of a contact structure or a metallization layer, depending on the overall strategy. For this purpose, the dielectric material 131 may be deposited by any appropriate deposition technique so as to provide the material 131 with a desired composition. In other cases, a manufacturing strategy may be applied for forming the layer 130, as will also be described with respect to the layer 140, if a reduced parasitic capacitance may be required in the layer 130 on the basis of self-aligned air gaps. Thereafter, the dielectric material 131 may be patterned and the conductive regions 132 may be formed on the basis of any well-established process strategy. Thereafter, the device 100 may be exposed to a deposition ambient 102, in which the dielectric material 141 may be deposited, for instance, by chemical vapor deposition (CVD), spin-on techniques and the like, depending on the type of dielectric material to be used in the layer 141. In some illustrative embodiments, the dielectric material 141 may comprise an etch stop material if considered necessary for patterning the layer 141 in a subsequent manufacturing stage. In other cases, two or more different material compositions may be used during the deposition process 102 in order to appropriately adjust the overall characteristics of the layer 141, for instance with respect to etch stop capabilities, copper confinement and the like. It should be appreciated that, typically, the "density" of metal features in the dielectric layer 141 may be less critical with respect to parasitic capacitance since vertical vias may have to be formed therein in order to connect to some of the conductive regions 132. Consequently, the dielectric material 141 may be provided with appropriate material characteristics in view of overall mechanical stability, metal confinement capability, etch stop characteristics and the like, rather than providing a very low overall permittivity. Additionally, a thickness of the layer 141 may be selected in accordance with a desired depth of corresponding vias to be formed in the layer 141.

Figure 1B:
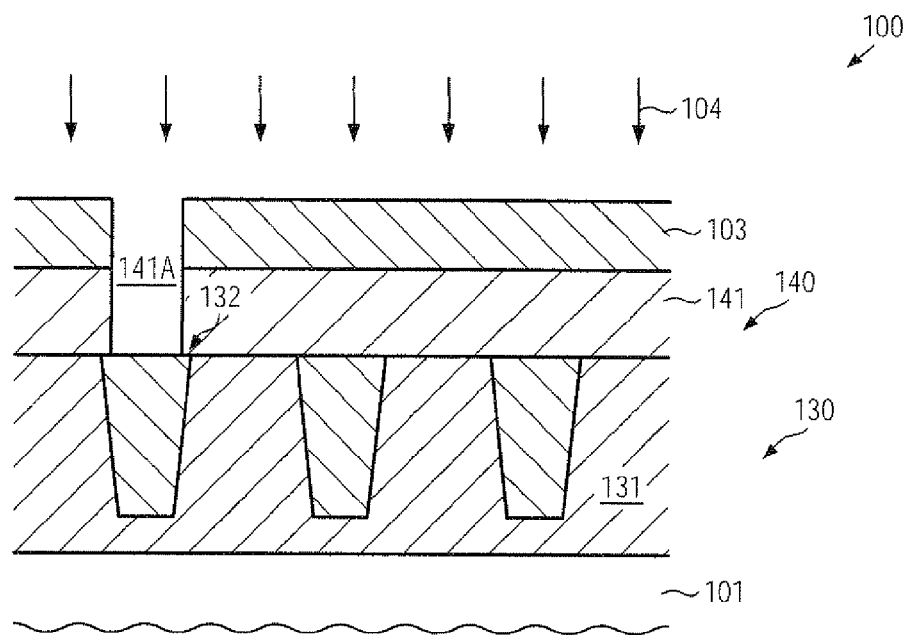

FIG. 1b schematically illustrates the device 100 in a further advanced manufacturing stage in which a mask layer 103, such as a resist mask, possibly in combination with a hard mask material, a hard mask layer and the like, may be formed above the dielectric material 141 in order to act as an etch mask in an etch process 104. Consequently, during the etch process 104, a via opening 141A may be formed in the dielectric material 141 in accordance with the overall design rules of the device 100. For example, a lateral extension or width of the via opening 141A may be approximately 100 nm and significantly less if sophisticated semiconductor devices are considered. The mask layer 103 may be formed on the basis of well-established lithography techniques, in which a resist material may be patterned on the basis of a lithography mask and may be used as an etch mask, possibly in combination with additional materials, such as an anti-reflective coating (ARC) material and the like. It should be appreciated that less demanding process conditions may be established since the via opening 141A may be formed through the dielectric material 141 without requiring the patterning of a moderately thick dielectric material or layer stack, as may frequently be the case in conventional process strategies. Consequently, the via opening 141A may be positioned and dimensioned with a high degree of reproducibility due to the superior process conditions, for instance with respect to providing moderately thick resist layers, possibly in combination with sophisticated hard mask materials and the like. Moreover, during the etch process 104, process parameters may be appropriately selected so as to adjust the desired shape of the opening 141A, for instance with respect to sidewall angles and the like. For this purpose, appropriate process parameters, such as the control of incorporation of polymer species into the etch ambient 104 and the like, may be controlled in order to reduce or increase a lateral etch rate during the advance of the etch front when etching through the dielectric material 141. As previously explained, the dielectric material 141 may comprise an etch stop material, if considered appropriate, while in other cases the material of the conductive regions 132 may act as an appropriate etch stop material.

Figure 1C:
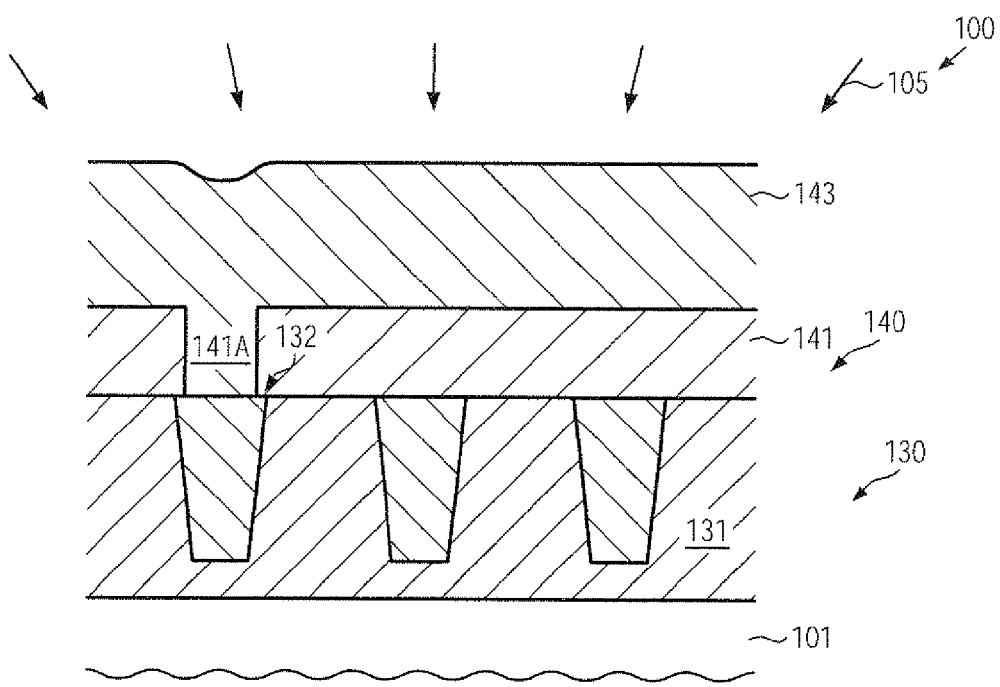

FIG. 1c schematically illustrates the device 100 in a further advanced manufacturing stage, i.e., after the removal of the mask layer 103 (FIG. 1b). Furthermore, the device 100 may be exposed to a deposition process 105 in order to form a sacrificial material 143 on the dielectric material 141 and in the via opening 141A. The sacrificial material 143 may comprise any appropriate material composition, which, in some illustrative embodiments, may exhibit a high etch selectively with respect to the material 141 in view of an etch chemistry to be applied in a later manufacturing stage for patterning the material 143. It should be appreciated that a composition of the material 143 may be selected in view of superior process conditions during the further processing of the device 100 and in view of desired material characteristics if a part of the sacrificial material 143 is to be preserved, rather than requiring a very low dielectric constant. As previously explained, the material 143 may be removed from critical device areas in which a reduced parasitic capacitance between neighboring metal regions is required, which may be formed in the material 143 in a later manufacturing stage. In some illustrative embodiments, the material 143 may be provided in the form of a dielectric material that may be deposited on the basis of spin-on techniques, while in other cases any other appropriate deposition process may be applied, such as CVD-like processes and the like. For example, a plurality of oxide-based materials may be deposited by spin-on techniques, CVD and the like, and also polymer materials may be applied by spin-on techniques as long as the characteristics thereof are compatible with the further processing. In some illustrative embodiments, the sacrificial material 143 may be substantially completely removed in a later manufacturing stage so that the characteristics thereof may be selected with respect to the further processing only, without requiring specific characteristics in view of mechanical stability, heat dissipation and the like. In one illustrative embodiment, the material 143 may be provided in the form of a carbon material, which may be applied during the deposition process 105 as a diamond-like material, thereby providing insulating characteristics, while in other cases a substantially amorphous carbon material may be provided, which may exhibit electrical conductivity while also providing superior heat dissipation capabilities. Also, carbon material, even if provided in the form of an insulating material, may provide superior heat dissipation capabilities compared to a plurality of other conventional dielectric materials. Furthermore, carbon material may be removed on the basis of well-established plasma based ashing processes or wet chemical process techniques so that the dielectric material 141, for instance provided in the form of a silicon nitride based material, may provide a high degree of etch selectivity during a corresponding etch process. The material 143 may be deposited with an appropriate thickness that may substantially correspond to a depth of metal regions still to be formed in the sacrificial material 143. Furthermore, in the embodiment shown, the material 143 may also be formed in the via opening 141A, which may result in a certain surface topography above the via opening 141A, which may, however, be compensated for by the deposition and treatment of subsequent material layers, such as a hard mask material, a resist material and the like in order to pattern the sacrificial material 143. In still other cases, the material 143 may be planarized, for instance by CMP and the like, if the resulting surface topography is considered inappropriate.

Figure 1D:
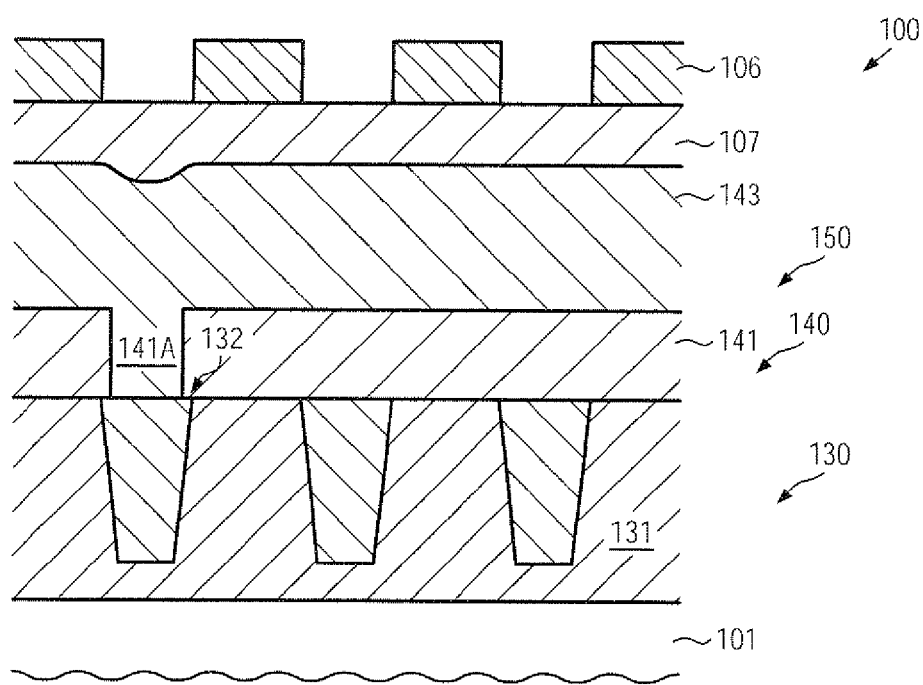

FIG. 1d schematically illustrates the device 100 in a further advanced manufacturing stage in which a further etch mask 106 may be formed above the sacrificial material 143, possibly in combination with any hard mask material 107, which may also act as an ARC material, as a stop material in a later manufacturing stage and the like. For example, the etch mask 106 may represent a patterned resist material, which may have an appropriate thickness in order to pattern the material 107, which may then be used for etching through the sacrificial material 143. As illustrated, by means of the layers 106, 107, any non-uniformities of the surface topography of the sacrificial material 143 may be compensated for, while, in other cases, if the surface topography is considered inappropriate for performing a corresponding lithography process, a planarization may be applied to the layer 143 or the layer 107 prior to actually forming the etch mask 106. The mask 106 in combination with the layer 107 may be formed on the basis of well-established process techniques, wherein superior conditions may also be provided during the deposition of the materials 107 and 106, since the sacrificial material 143 may be less critical compared to sophisticated low-k dielectric materials. Furthermore, an increased mechanical stability may be provided on the basis of the material 141, 143, thereby enabling an additional planarization on the basis of a polishing process, if required, substantially without compromising integrity of the metallization system 150.

Figure 1E:
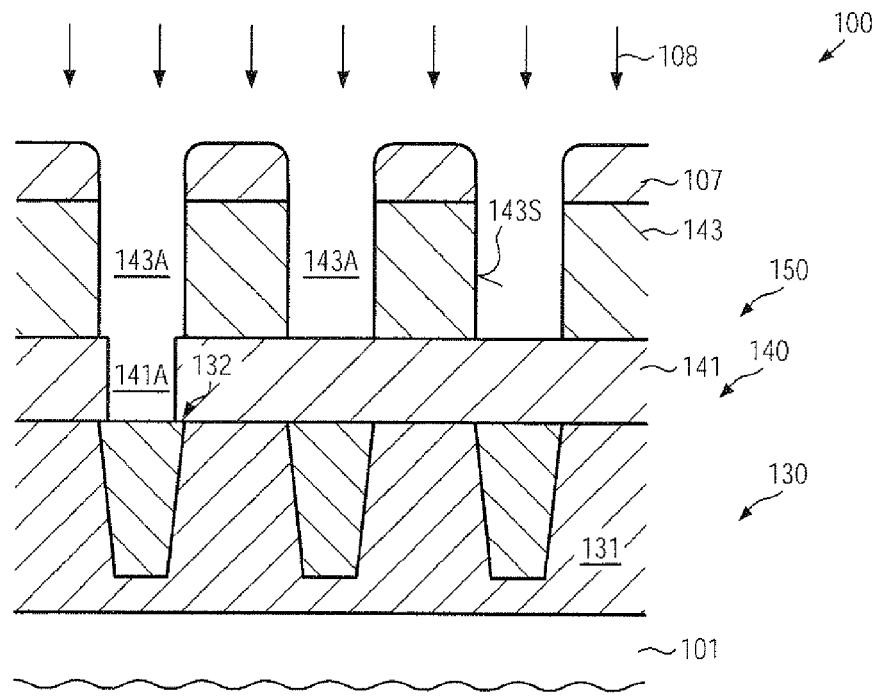

FIG. 1e schematically illustrates the device 100 during an etch process 108, in which trenches 143A may be formed in the sacrificial material 143 on the basis of the patterned layer 107. The etch process 108 may be performed on the basis of an appropriate etch recipe for obtaining the trenches 143A, one of which may connect to the via opening 141A, wherein the superior etch selectivity of the material 141 with respect to the sacrificial material 143 may provide enhanced etch conditions, for instance, compared to conventional strategies in which sensitive low-k dielectric materials may have to be etched. Consequently, the inclination of sidewalls 143S of the openings 143A may be appropriately adjusted by selecting appropriate parameter values, as previously explained. Moreover, the etch process 108 may be efficiently controlled on the basis of the material 141, which may act as an etch stop material, while the etch front may advance into the via opening 141A, thereby also efficiently removing the material 143 therein. Consequently, the via opening 141A may be efficiently "reopened" during the etch process 108 without significantly compromising the overall size and shape of the trenches 143A. Consequently, since the opening 141A and the trenches 143A may be formed on the basis of less demanding process conditions, in total the overall uniformity and reproducibility in patterning the materials 141 and 143 may be enhanced compared to conventional strategies.

Figure 1F:
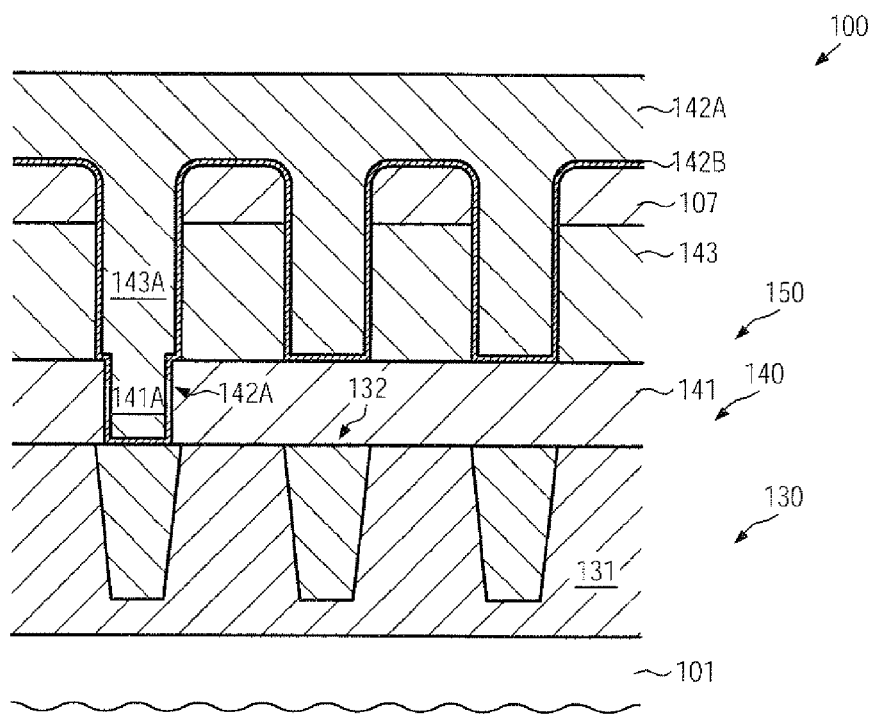

FIG. 1f schematically illustrates the device 100 with the addition of a metal layer 142A, for instance comprising a copper species or any other highly conductive metal material, possibly in combination with a conductive barrier material 142B. For example, a plurality of materials may be used in combination with a copper-based material in order to provide superior electromigration and copper confinement. For instance, tantalum, tantalum nitride, titanium, titanium nitride, a plurality of alloys such as a cobalt, tungsten, phosphorous alloy and the like may be used for this purpose. In other cases, the material 142A may be provided without a dedicated conductive barrier material since the dielectric material 141 may provide the desired copper diffusion blocking effect, while a lateral diffusion may be substantially restricted by removing the sacrificial material 143, at least in critical device areas, as will be described later on in more detail.

The device 100 as illustrated in FIG. 1f may be formed on the basis of the following processes. The layer 142B, if provided, may be formed on the basis of any appropriate deposition technique, such as sputter deposition, electrochemical deposition, CVD-like deposition and the like. In some illustrative embodiments, an appropriate seed material, for instance in the form of a copper material, may be deposited on the layer 142B, if provided, while in other cases an appropriate seed material may be directly deposited on exposed surface areas of the trenches 143A and in the via opening 141A. A corresponding seed layer may act as a current distribution layer during a subsequent electroplating process, while in other cases the corresponding seed material may act as a catalyst material for initiating an electrochemical deposition, such as an electroless deposition process. In other cases, a corresponding seed layer may be omitted if the conductive barrier material 142B may be appropriate for directly depositing thereon the highly conductive metal material 142A. Next, the conductive material 142A may be deposited, for instance, by electrochemical deposition techniques in which a substantially bottom-to-top fill behavior may be accomplished, thereby filling the via opening 141A and the corresponding trench 143A in a common fill process. It should be appreciated that, in other illustrative embodiments, as will be described later on, the via opening may be filled separately and subsequently the sacrificial material 143 may be formed, thereby further reducing the complexity of the corresponding fill process for filling the trenches 143A.

It should be appreciated that, in some illustrative embodiments, prior to actually depositing the material 142B or any seed material, typically, a cleaning process may be performed on the basis of wet chemical recipes, wherein, however, contrary to conventional strategies based on low-k dielectric materials and ultra low-k dielectric materials, less aggressive chemicals may be applied, thereby avoiding any undue etching of exposed portions of the conductive regions 132. For example, as previously explained, the regions 132 may represent metal lines of a metallization layer which may have formed thereon conductive cap materials that may have a very low etch resistivity with respect to a plurality of wet chemical cleaning recipes, as may be required when removing contaminants from sophisticated low-k dielectric materials. In this case, a pronounced under-etching may occur, thereby contributing to a non-reliable fill process upon forming the materials 142B and 142A. Consequently, by using the materials 143, 141 with appropriate material characteristics, superior cleaning recipes may be used in order to avoid undue under-etching of sensitive conductive cap materials.

Figure 1G:
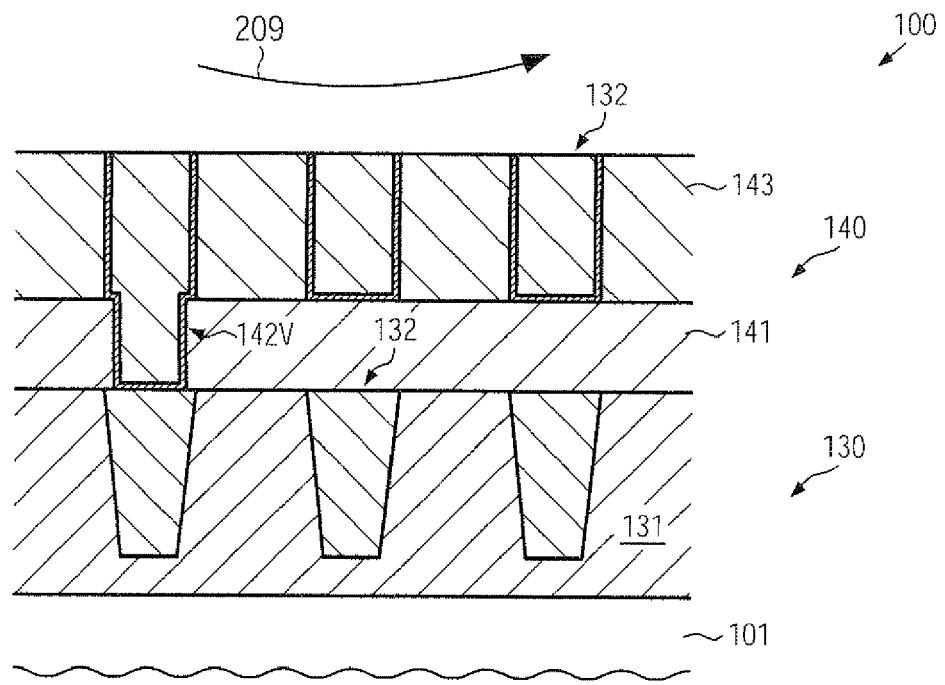

FIG. 1g schematically illustrates the device 100 during a material removal process 109 that is designed to remove any excess material of the layers 142A, 142B (FIG. 10. For example, the material removal process 109 may comprise a chemical mechanical planarization or polishing process, possibly in combination with other material removal techniques, such as electro polishing, electro etching and the like, wherein the material 143 may act as an efficient stop material upon removing any residues of the layer 107 (FIG. 10. In other cases, an appropriate stop material may be incorporated in the layer 107 and may be used for removing excess material of the layers 142A, 142B, followed by a further removal process in which the stop layer of the layer 107 may be removed selectively to the material 143. For example, the material 143, when provided in the form of a carbon material, may exhibit excellent stop characteristics in a CMP process, thereby resulting in enhanced uniformity of resulting metal regions 142, since a pronounced material erosion of material 143 in spaces between two adjacent regions 142 may be significantly reduced. Consequently, after completing the removal process 109, the metal regions 142 may be provided in the form of electrically isolated regions within the material 143, wherein one of the metal regions 142 may connect to a via 142V, which in turn may connect to one of the metal regions 132 of the layer 130.

Figure 1H:
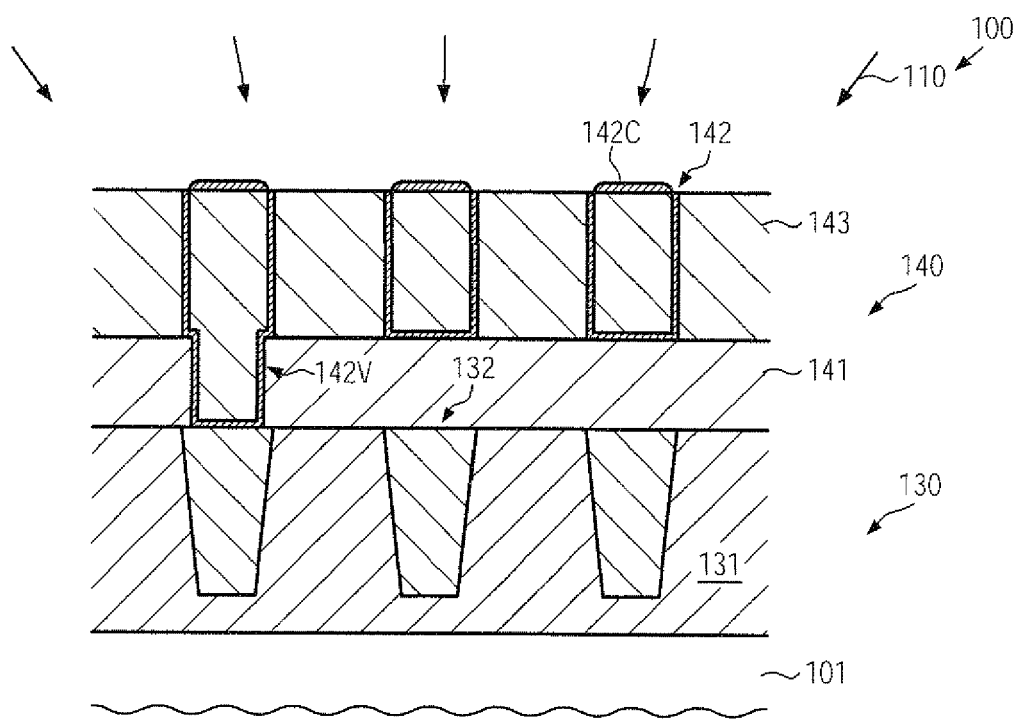

FIG. 1h schematically illustrates the device 100 when exposed to a deposition process 110, in which a conductive cap material 142C may be selectively deposited on exposed surface portions of the metal regions 142. As previously explained, the cap materials 142C may provide superior electromigration performance without unduly reducing the overall conductivity of the metal regions 142. The deposition process 110 may include a selective electrochemical deposition process in which the metal regions 142 may act as a catalyst material for selectively forming thereon the cap layers 142C. Due to the superior uniformity of the metallization layer 140, after the removal process 109 (FIG. 1g), enhanced conditions may also be encountered during the deposition process 110, thereby also providing superior selectivity of the material deposition, which in turn may contribute to a superior overall uniformity of the characteristics of the metallization layer 140. Furthermore, the selectivity of the deposition process 110 may be enhanced compared to other approaches relying on porous low-k materials, since an unwanted deposition of conductive material on the sacrificial layer 143 may be significantly less compared to the porous structure of sophisticated low-k dielectrics. In other cases, the deposition process 110 may be omitted, for instance when the interface characteristics of a dielectric material to be formed on the metal regions 142 in a further advanced manufacturing stage are considered appropriate for achieving the desired electromigration performance. For example, a plurality of dielectric materials, such as silicon nitride, nitrogen-containing silicon carbide, silicon carbide and the like, may provide a strong interface with a copper-based material, possibly in combination with additional surface treatments, thereby resulting in the desired electromigration behavior.

Figure 1I:
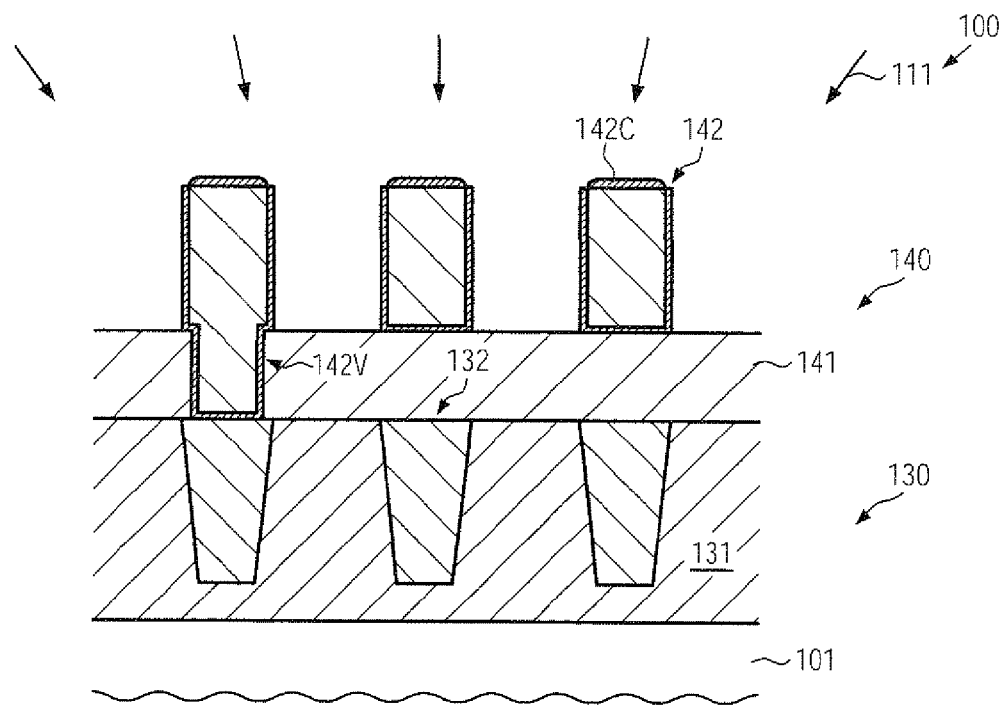

FIG. 1i schematically illustrates the device 100 in a further advanced manufacturing stage in which an etch process 111 may be performed in order to remove at least a portion of the sacrificial material 143 (FIG. 1h). For this purpose, an appropriate etch recipe may be applied, for instance in the form of a plasma assisted etch chemistry, such as an oxygen-based chemistry for ashing the material 143, without unduly affecting the metal regions 142. For instance, a plurality of conductive and dielectric materials may be efficiently etched on the basis of appropriate plasma-based etch chemistries selectively with respect to copper material, conductive barrier materials, such as tantalum, conductive cap materials and the like. Furthermore, during the etch process 111, the etch selectivity between the material 143 and the dielectric material 141 may be used in order to reliably control the process 111. As explained above, silicon nitride based materials or silicon carbide based materials may exhibit a high selectivity with respect to a plurality of etch chemistries. In other cases, the etch process 111 may comprise a wet chemical etch recipe for removing the sacrificial material 143, substantially without negatively affecting the metal regions 142 and the dielectric material 141. For example, APM (ammonium hydroxide peroxide mixture) and the like, which may frequently be used as cleaning agents, may also be applied during the etch process 111. It should be appreciated that, due to the provision of two different materials for the metallization layer 140, a high degree of flexibility in selecting appropriate materials for the layer 141 and the layer 143 may be achieved, thereby also providing a high degree of flexibility in selecting appropriate etch chemistries. For example, even conductive materials, such as carbon, silicon and the like, may be efficiently used for forming the metal regions 142 and these materials may be efficiently removed from corresponding device regions, which may comprise functional metal features, such as the metal regions 142, during which electrical insulation may be required. On the other hand, if desired, the corresponding sacrificial material, even in the form of an electrically conductive material, may be maintained in other device areas in which leakage currents may not occur or may not negatively affect the overall performance of the device 100.

Figure 1J:
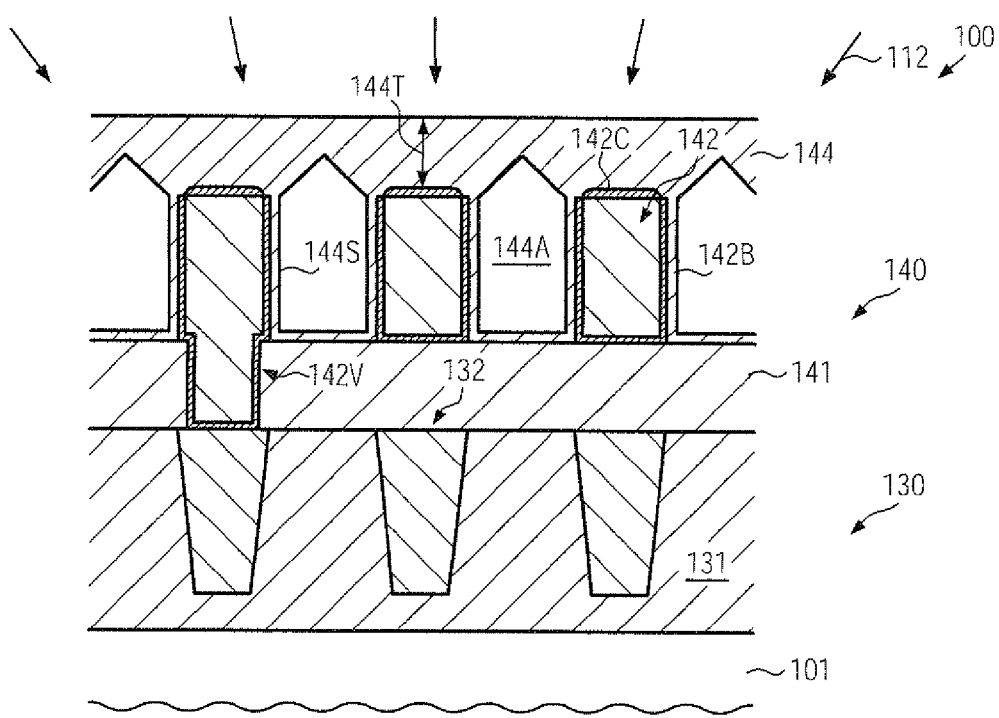

FIG. 1*j* schematically illustrates the device 100 when exposed to a deposition ambient 112, in which a dielectric cap material 144 may be deposited above the metal regions 142 so as to form corresponding air gaps 144A between a neighboring two regions of the metal regions 142. For this purpose, the deposition process 112 may be performed on the basis of any appropriate deposition technique, such as plasma enhanced CVD and the like, wherein, in a moderately early phase of the process 112, respective overhangs may form between the closely spaced metal regions 142, thereby "closing" the air gaps 144A. Thereafter, further material may be deposited above the air gaps 144A and the metal regions 142 with a thickness 144T as may be required for the further processing of the device 100. In some illustrative embodiments, the dielectric material 144 may have appropriate material characteristics for acting as an etch stop material for forming therein metal vias of a subsequent metallization layer to be formed above the metallization layer 140. For example, the material 144 may have similar characteristics as is explained with reference to the dielectric material 141. In some illustrative embodiments, the material 144 may have a copper confining effect, thereby forming an appropriate interface with a copper-based material of the metal regions 142, which may provide the desired electromigration performance. If required, an additional surface treatment may be performed prior to depositing the material 144, if further enhanced characteristics with respect to copper confinement and electromigration performance may be required.

It should be appreciated that, in other illustrative embodiments, the metal regions 142 may be formed without providing a conductive barrier material, such as the layer 142B, and without the cap layer 142C, when the corresponding material characteristics of the cap layer 144 are considered appropriate for obtaining the electromigration performance and copper confinement, which, however, may be less critical due to the presence of the air gaps 144A. That is, during the deposition process 112, exposed sidewall surface areas of the metal regions 142 may be covered by material 144S of the layer 144, thereby providing the appropriate interface characteristics. On the other hand, at the bottom of the metal regions 142, the dielectric material 141 may provide the copper confinement and thus integrity of the metal regions 142 during the further processing, and the operation of the device 100 may be ensured by encapsulating the regions 142 on the basis of the materials 144 and 141. Also, in this case, prior to performing the deposition process 112, a surface treatment, for instance by forming a copper silicide at the exposed copper surface areas, may be applied in order to further enhance overall electromigration performance.

Figure 1K:
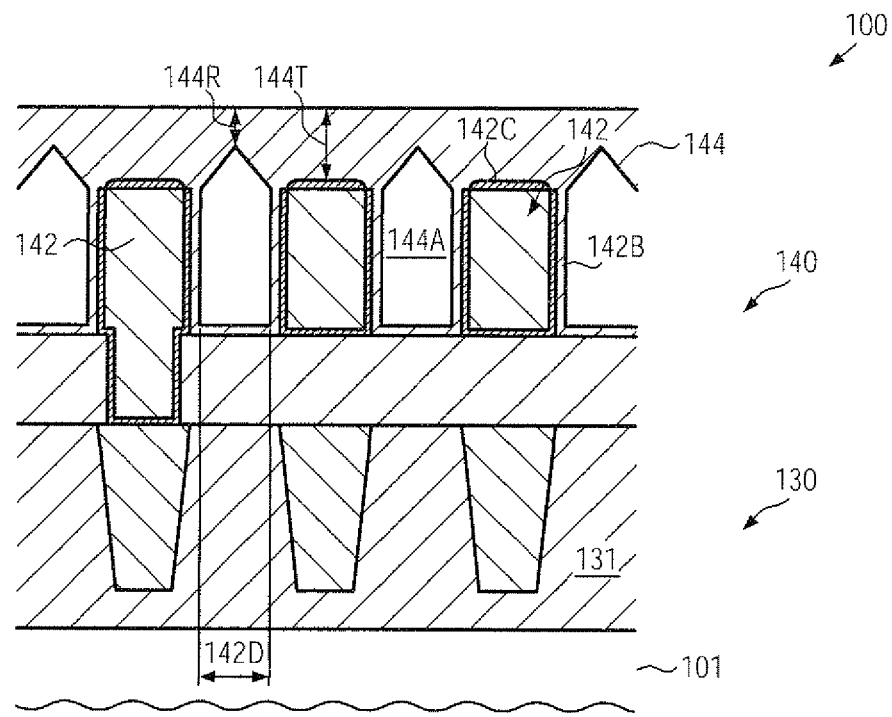
FIGS. 1k-1m schematically illustrate cross-sectional views of semiconductor devices in which a control of a cap layer height may be appropriately performed so as to reliably close gaps between adjacent metal lines, according to illustrative embodiments.
Figure 1L:
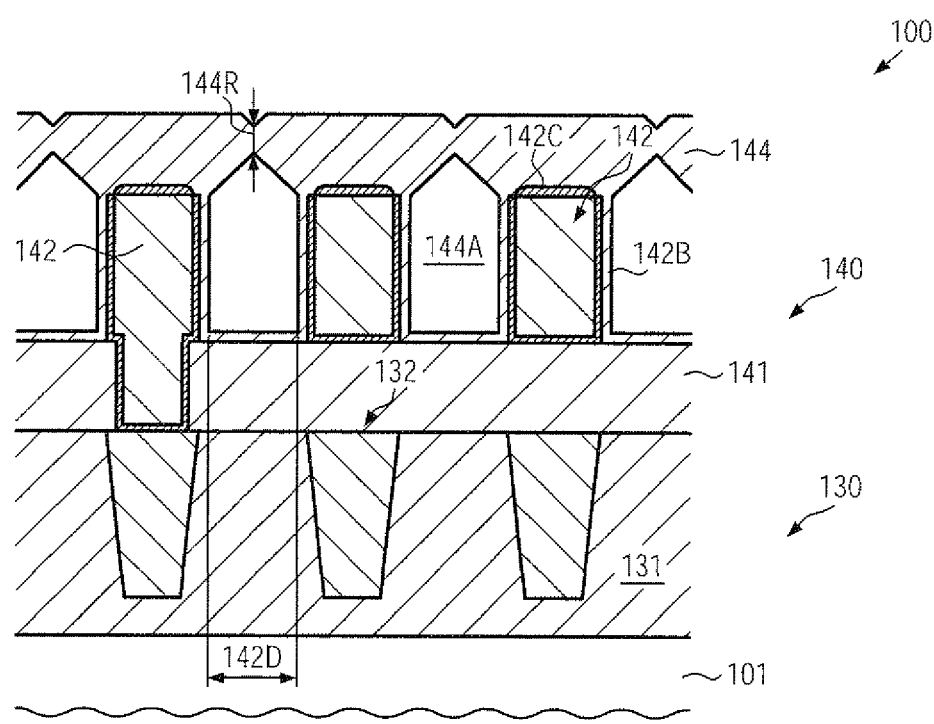
Figure 1M:
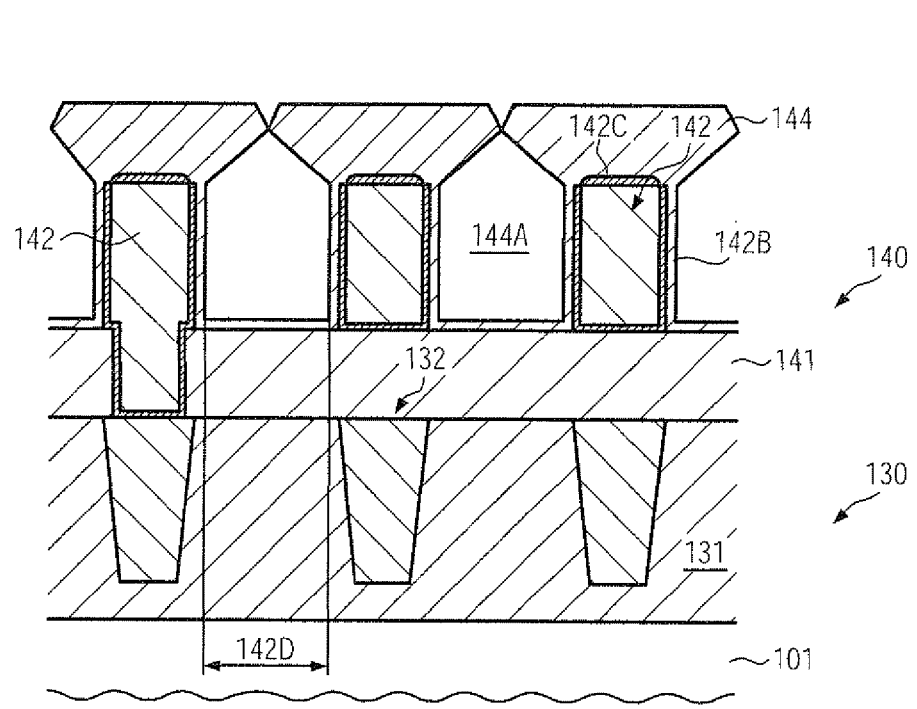

With reference to FIGS. 1*k*-1*m*, a process strategy will be described in which an appropriate thickness 144T may be selected in order to reliably close the air gaps 144A.

FIG. 1*k* illustrates the device 100 according to an embodiment in which the desired thickness 144T may be obtained, while also a sufficient reduced thickness 144R above an air gap 144A may be realized during the deposition process 112 (FIG. 1*j*). For this purpose, a distance between neighboring metal regions 142, indicated as 142D, may be selected so as to obtain an early and reliable closure of the air gaps 144A during the deposition of the material 144.

FIG. 1*l* schematically illustrates the device 100 according to a configuration in which the distance 142D may be selected greater than in FIG. 1*k*, thereby reducing the thickness 144R, which may still be compatible with process margins for the further processing of the device 100.

FIG. 1*m*, on the other hand, illustrates the device 100 according to a situation in which the distance 142D may be further increased, thereby resulting in a non-reliable sealing of the air gaps 144A. Consequently, a corresponding configuration may be non-acceptable or may be acceptable in device regions only in which non-functional metal features are to be provided. It should be appreciated that an appropriate distance 142D may be adjusted by appropriately adapting the corresponding design rules, which may not negatively affect the overall processing and performance of the semiconductor device 100. That is, since the air gaps 144A may be formed in a self-aligned manner without requiring lithography techniques, a reduction of the distance between closely spaced metal regions may be applied, as long as this is compatible with the patterning capabilities for forming openings in the sacrificial material. Consequently, based on given deposition parameters and material characteristics, an appropriate distance 142D may be selected in order to obtain a reliable closure of the air gaps 144A.

After depositing the layer 144 and possibly planarizing the same, the further processing may be continued by forming a via opening in the cap layer 144, thereby using the cap layer 144 as a dielectric material of a subsequent metallization level.

Figure 1N:
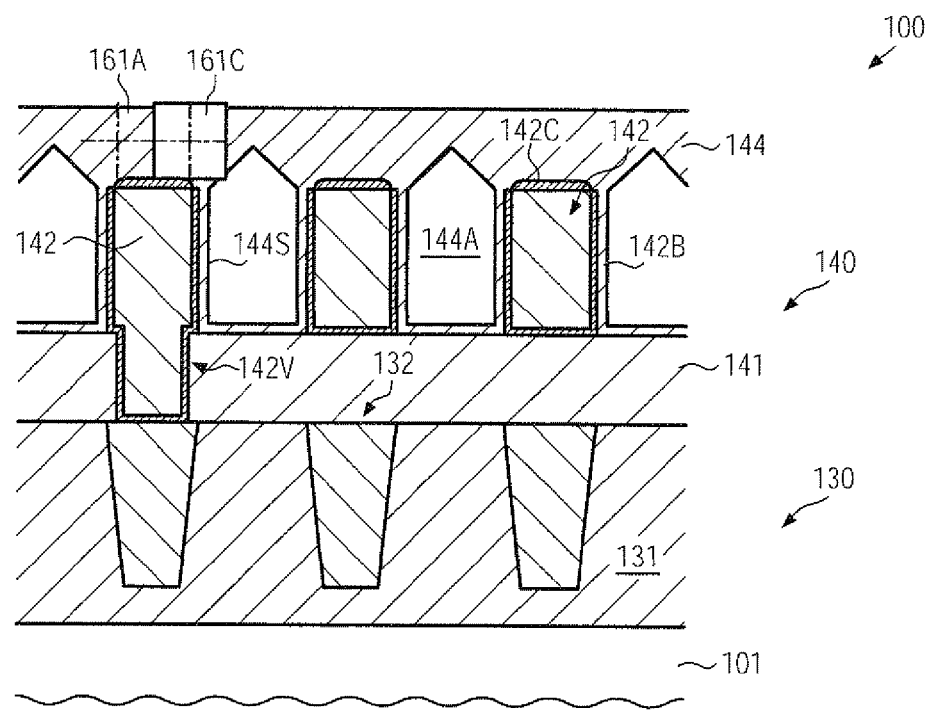
FIGS. 1*n*-1*p* schematically illustrate cross-sectional views of semiconductor devices according to a strategy for reducing the probability of misaligning vias to be formed so as to connect to metal regions having adjacent air gaps, according to illustrative embodiments.
Figure 1O:
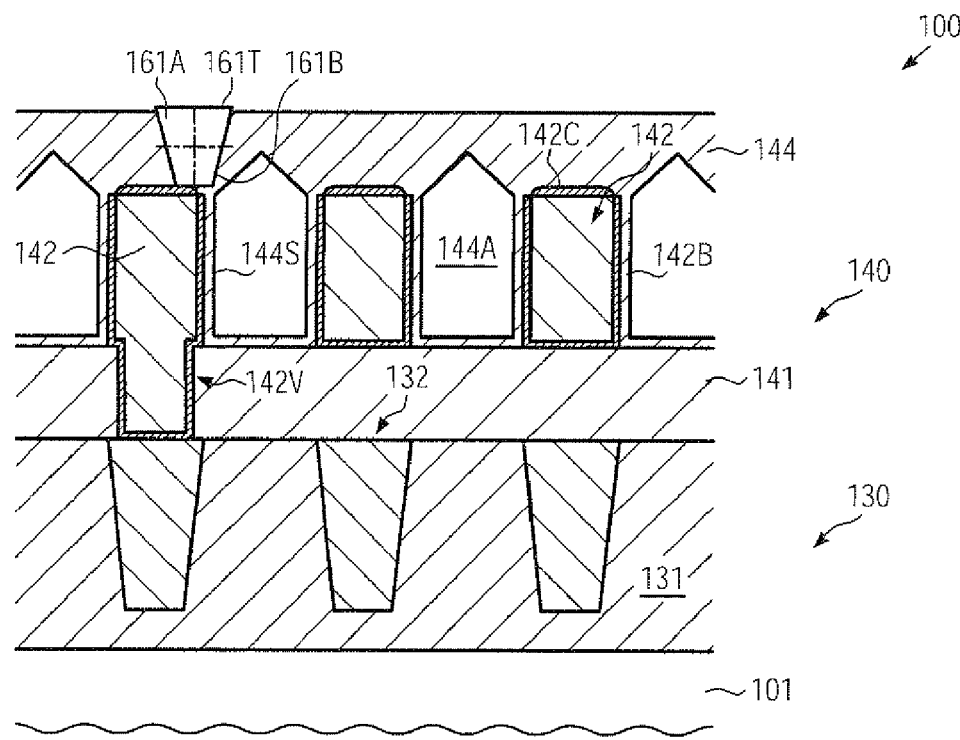
Figure 1P:
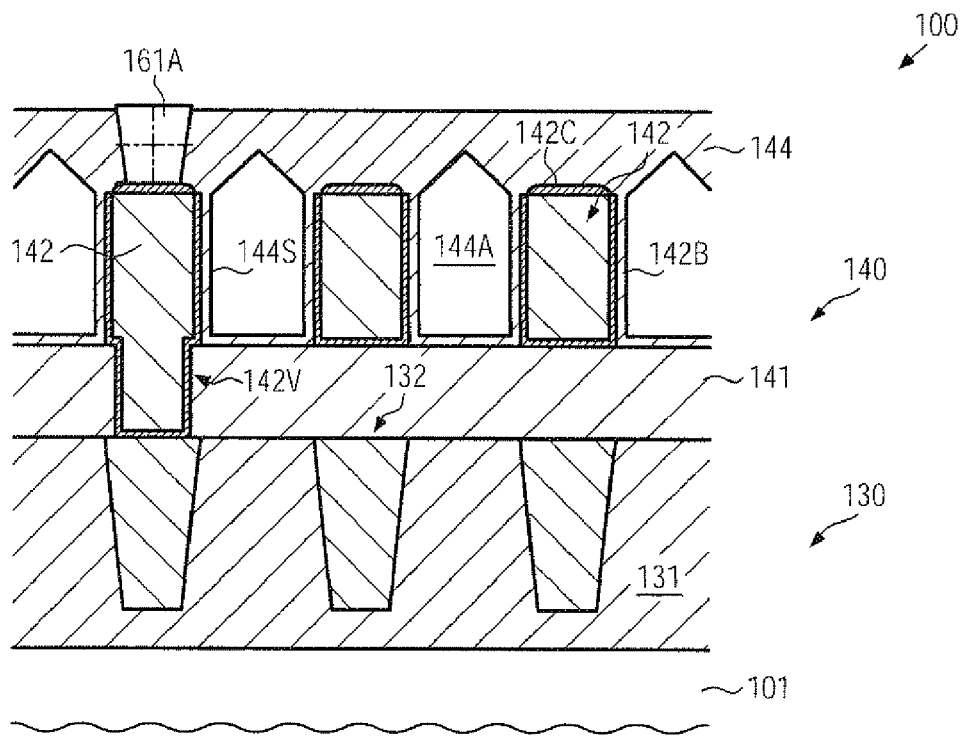

With reference to FIGS. 1*n*-1*p*, further illustrative embodiments will be described in which superior alignment of via openings to be formed in the cap layer 144 may be applied.

FIG. 1*n* schematically illustrates the device 100 in a further advanced manufacturing stage in which a via opening 161A of a further metallization level in the material 144 is formed. In this case, due to the superior process conditions for patterning the material 144, as previously described with reference to the layer 141, a precise alignment may be accomplished in order to appropriately position the opening 161A. Hence, a significant misalignment of via openings, such as illustrated for an opening 161C, may be substantially reduced compared to conventional strategies by patterning the layer 144 in a separate process sequence, as discussed above.

FIG. 1o schematically illustrates the device 100 according to further illustrative embodiments in which the probability of opening the air gaps 144A due to a significant misalignment of the via opening 161A may be further reduced by providing the via opening 161A with a pronounced tapering. That is, sidewall surface areas of the opening 161A may be formed such that a significantly reduced dimension or width of the opening 161A may be obtained at the bottom 161B compared to the width at the top 161T. Consequently, even if a certain degree of misalignment may occur, the tapering may result in a significantly reduced probability of connecting to the air gap 144A, thereby even further enhancing overall reliability and reproducibility of the metallization layer 160. It should be appreciated that a corresponding degree of tapering may be accomplished by appropriately selecting process parameters, as is for instance previously described with reference to the via opening 141A (FIG. 1b).

FIG. 1p schematically illustrates the device 100 in which the via opening 161A may be provided with a moderate degree of tapering and with enhanced overlay accuracy thereby further reducing the probability of opening the air gaps 144A.

Consequently, the further processing may be continued by depositing a sacrificial material and patterning the same, as previously explained with reference to the metallization layer 140.

Figure 1Q:
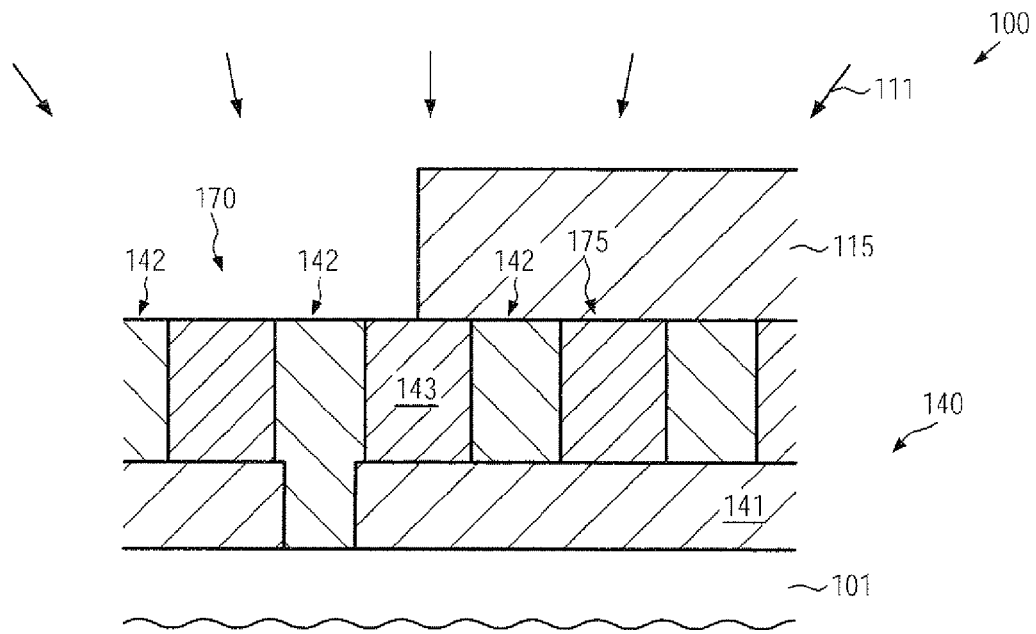
FIGS. 1*q*-1*r* schematically illustrate cross-sectional views of the semiconductor device according to embodiments in which the sacrificial material may be selectively preserved in certain device areas, according to illustrative embodiments.
Figure 1R:
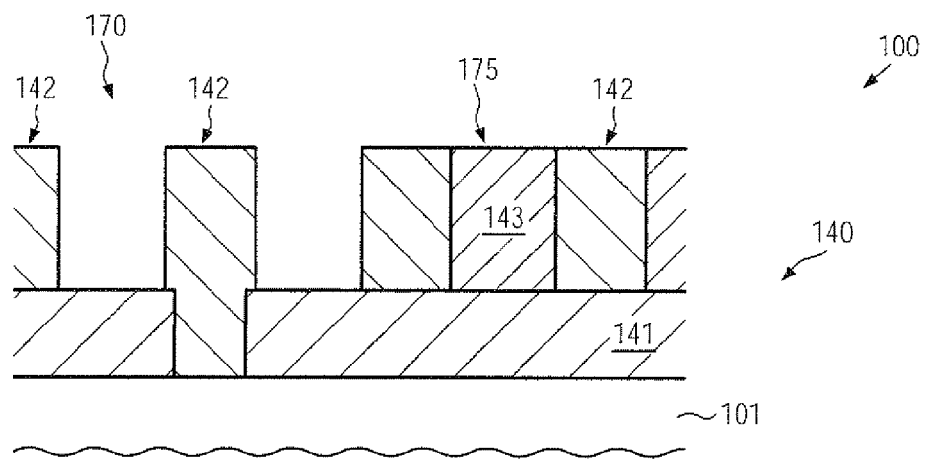

With reference to FIGS. 1q-1r, further illustrative embodiments will now be described in which the sacrificial material may be removed selectively from specific device areas, while preserving the sacrificial material in other device areas.

FIG. 1q schematically illustrates the device 100 with an etch mask 115 that may cover a device area 175 including a plurality of metal regions 142 while exposing a device area 170, which may include metal regions 142 between which an air gap is required. Furthermore, the device 100 may be exposed to the etch ambient 111 for removing the exposed portion of the sacrificial material 143 selectively with respect to the exposed metal regions 142 and the dielectric material 141, as is also previously discussed with reference to FIG. 1i. The etch mask 115 may be provided in the form of a resist mask, or any other appropriate material, which may be accomplished on the basis of non-critical lithography techniques.

FIG. 1r schematically illustrates the device 100 after the selective removal of the material 143 so that the metal regions 142 in the device area 170 may be provided as isolated metal regions, while the metal regions 142 in the device area 175 may be embedded in the remaining material 143. Consequently, the further processing may be continued by depositing the cap material 144 (FIG. 1j) in order to form an air gap between the regions 142 in the area 170, while the material 144 may be deposited on the sacrificial material 143. As previously explained, preserving the material 143 in certain device areas, such as the area 175, may be advantageous in some respects, for instance for enhancing overall heat dissipation capabilities of the metallization layer 140 since the material 143 may provide superior heat conductivity. Thus, an appropriate heat dissipation system may be appropriately configured so as to thermally connect to the area 175. Consequently, appropriate heat dissipation spots may be appropriately positioned across the metallization system in order to enhance the overall operational behavior. For example, the material 143 may be provided in the form of a carbon material, which may per se exhibit superior heat conductivity characteristics. In some illustrative embodiments, the metal regions 142 may represent non-functional elements or dummy elements so that the material 143 may even be provided as a conductive material, thereby even further enhancing the heat dissipation capabilities and possibly providing superior shielding effect, if considered appropriate.

Figure 1S:
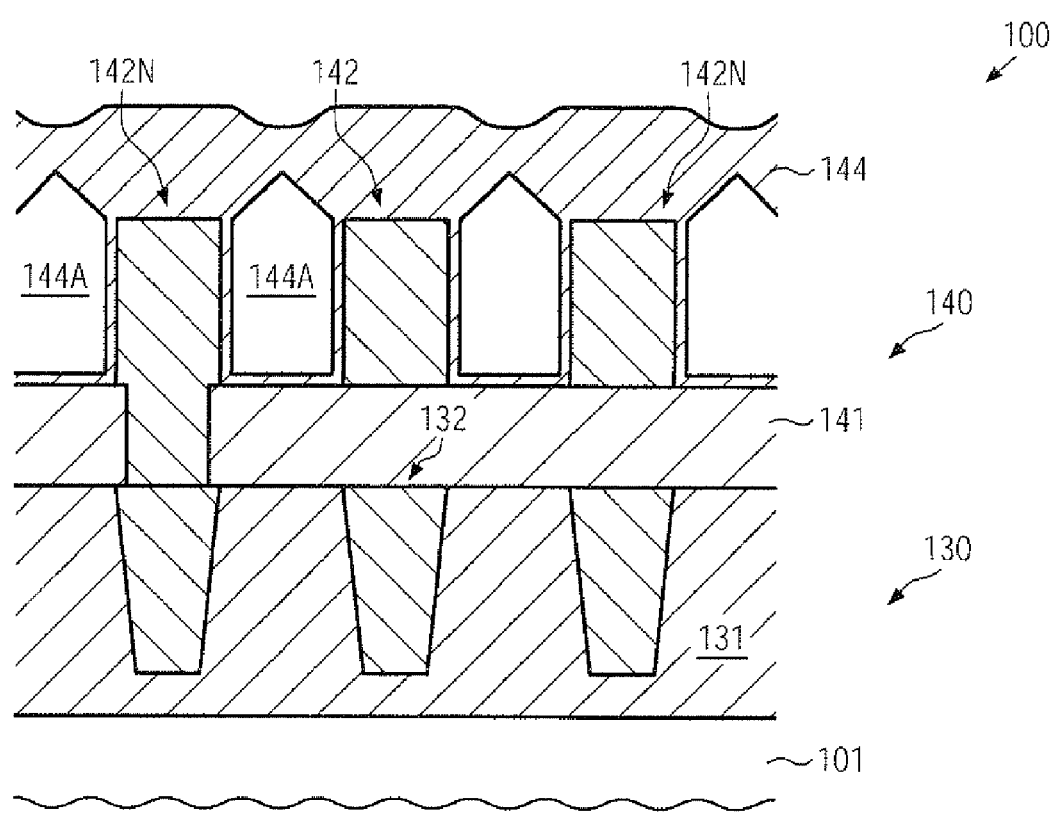
FIG. 1*s* schematically illustrates a cross-sectional view of the semiconductor device in which one or more dummy or non-functional metal regions may be formed so as to enhance overall process uniformity and/or increase heat dissipation capabilities and the like, according to illustrative embodiments.

FIG. 1s schematically illustrates the semiconductor device 100 according to further illustrative embodiments in which superior process uniformity may be accomplished by providing one or more dummy metal regions. As illustrated, metal regions 142 may be considered as functional metal regions, between which air gaps 144A may have to be provided. Furthermore, one or more non-functional metal regions 142N may be provided, for instance, so as to laterally enclose the functional metal regions 142, thereby providing substantially identical process conditions for forming the metal regions 142 and the cap material 144. Consequently, the air gaps 144A may be obtained with superior uniformity and reliability between the regions 142 and also between the dummy regions 142N and the adjacent regions 142. Although the air gaps 144A between the regions 142N, 142 may not be required for reducing the parasitic capacitance, nevertheless, more uniform conditions during the patterning and also during the operation of the device 100 may be established by providing the dummy regions 142N.

Figure 2A:
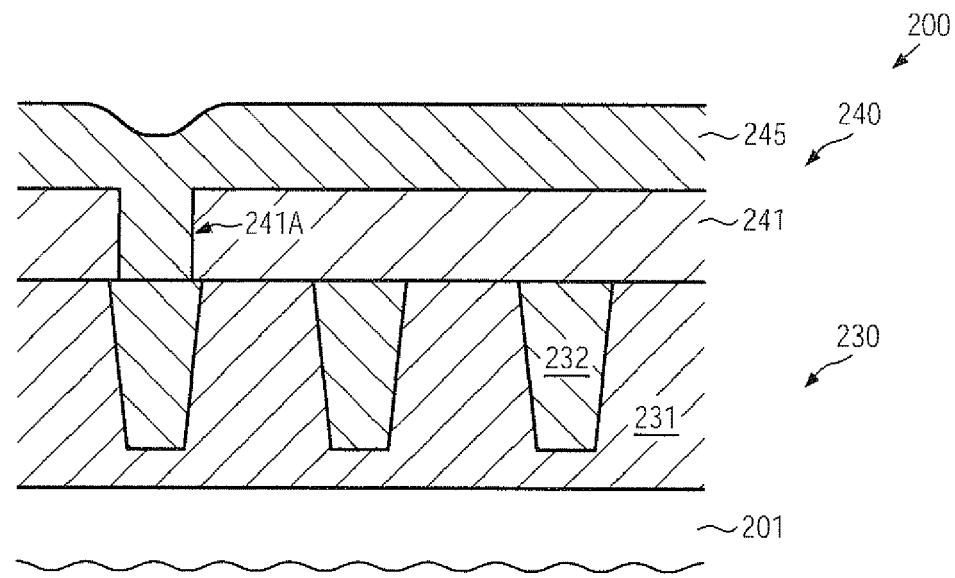
FIGS. 2*a*-2*b* schematically illustrate cross-sectional views of a semiconductor device during a process sequence for forming vias in a first portion of a dielectric material prior to depositing the sacrificial fill material, according to still further illustrative embodiments.
Figure 2B:
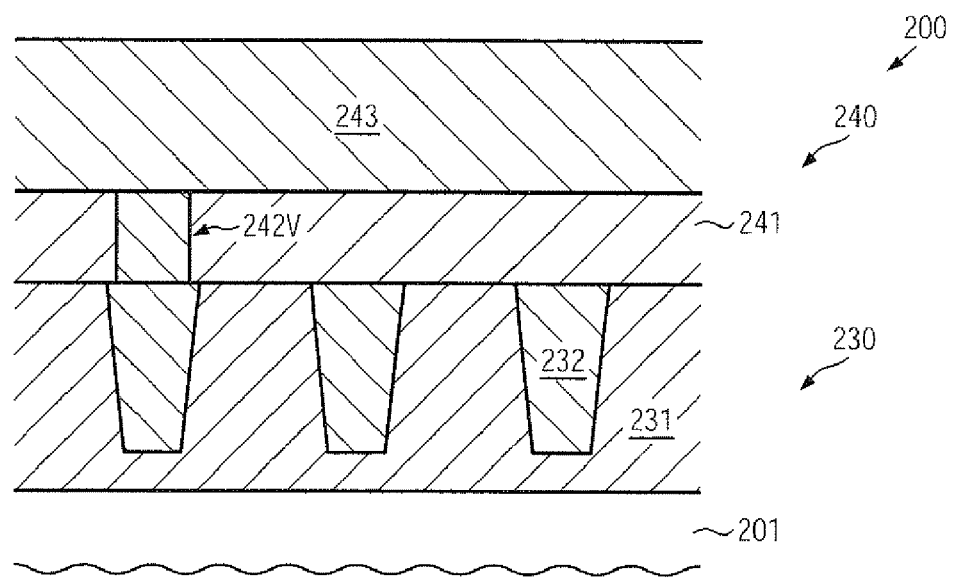

With reference to FIGS. 2a-2b, further illustrative embodiments will now be described in which a via may be formed prior to depositing a sacrificial material for forming therein metal lines of the corresponding metallization level.

FIG. 2a schematically illustrates a semiconductor device 200 comprising a substrate 201, a first metallization or contact layer 230 and a further metallization layer 240. The layer 230 may comprise a dielectric material 231 and conductive regions 232. Similarly, the metallization layer 240 may comprise a dielectric material 241, wherein, for the components described so far, the same criteria may apply as previously explained with reference to the device 100. Furthermore, the dielectric material 241 may comprise a via opening 241A formed in the dielectric material 241 so as to connect to one of the conductive regions 232. Moreover, the device 200 may comprise a metal material 245 so as to fill the via opening 241A with an appropriate metal-containing material. For example, the conductive material 245 may comprise a barrier material, such as one of the conductive barrier materials as previously explained with reference to the device 100, in combination with a highly conductive material, such as copper and the like. The layer 245 may be formed on the basis of any appropriate process sequence, for instance by forming a barrier material possibly in combination with a seed material, followed by an electrochemical deposition process. In some illustrative embodiments, the dielectric material 241 may have copper confining characteristics and may also result in a strong interface with the material 245, thereby providing sufficient electromigration performance in order to omit a corresponding barrier material. For example, the dielectric material 241 may be provided in the form of a silicon nitride based material, a nitrogen-containing silicon carbide material and the like, which may exhibit the required material characteristics in view of copper confinement and electromigration performance. Irrespective of the composition of the conductive material 245, it may be deposited on the basis of less critical process conditions, since the via opening 241A may represent an opening with a reduced aspect ratio, thereby enhancing overall step coverage and fill behavior of any deposition technique. Thereafter, the further processing may be continued by removing any excess material of the layer 245, for instance based on CMP and the like, wherein the dielectric material 241 may act as an efficient stop material, as is also previously explained with reference to the device 100.

FIG. 2b schematically illustrates the device 200 in a further advanced manufacturing stage in which a sacrificial material 243 may be formed above the dielectric material 241 and above, and in some illustrative embodiments on, a via 242V obtained during the preceding manufacturing sequence. With respect to the sacrificial material 243, the same criteria may apply as previously explained with reference to the device 100. Consequently, the material 243 may be deposited on the basis of enhanced surface conditions, thereby enhancing the further processing for patterning the material 243, which may be accomplished basically on the basis of similar process techniques as previously described.

As a result, the present disclosure provides microstructure devices such as semiconductor devices and manufacturing techniques in which sophisticated metallization systems may be formed on the basis of air gaps, which may be obtained on the basis of a self-aligned technique using a sacrificial material layer. During the process sequence, superior process conditions and thus enhanced device characteristics may be obtained by forming a via opening first and subsequently depositing the sacrificial material and patterning the same. The material characteristics of the dielectric material including the via opening may be taken advantage of in efficiently patterning the sacrificial material, which, in some illustrative embodiments, may be provided in the form of a carbon material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a via opening in a dielectric layer of a metallization layer of a semiconductor device;
   forming a sacrificial material layer above said dielectric layer and in said via opening;
   forming a plurality of trenches in said sacrificial material layer and removing portions of said sacrificial material layer positioned within said via opening, one of said plurality of trenches connecting to said via opening;
   forming metal regions in said plurality of trenches, one of said metal regions extending into said via opening;
   selectively forming a conductive cap layer on a top surface of each of said plurality of metal regions;
   removing said sacrificial material layer from between at least some of said metal regions; and
   depositing a dielectric cap layer so as to form air gaps between said at least some of said metal regions.

2. The method of claim 1, further comprising forming a second via opening in said dielectric cap layer, wherein said second via opening connects to one of said metal regions.

3. The method of claim 2, wherein forming said second via opening comprises forming inclined sidewall faces so as to reduce a width of said second via opening at a bottom thereof.

4. The method of claim 1, wherein removing said sacrificial material layer from between at least some of said metal regions comprises removing said sacrificial material from within a die area of said semiconductor device.

5. The method of claim 1, wherein removing said sacrificial material layer from between at least some of said metal regions comprises forming a mask so as to cover a selected area of said semiconductor device and performing an etch process using said mask as an etch mask.

6. The method of claim 1, wherein forming said plurality of trenches comprises forming at least one trench for a dummy metal region adjacent to a trench of a functional metal region so as to form an air gap between said dummy metal region and said functional metal region.

7. The method of claim 1, wherein forming said dielectric layer comprises depositing a nitrogen-containing dielectric material.

8. The method of claim 1, wherein forming said sacrificial material layer comprises forming a carbon-containing material.

9. The method of claim 1, wherein forming said metal region comprises depositing one or more metal-containing materials and removing excess material by a planarization process using said sacrificial layer as a stop layer.

10. A method, comprising:
    forming a sacrificial material above a dielectric material of a metallization system of a microstructure device and within a via opening formed in said dielectric material;
    forming a plurality of metal regions in said sacrificial material, one of said plurality of metal regions being formed in and above said via opening;
    removing said sacrificial material at least from between two adjacent metal regions of said plurality of metal regions and from within said via opening by using said dielectric material as an etch stop material;
    selectively forming a conductive cap layer on a top surface of each of said plurality of metal regions; and
    forming a dielectric cap layer above said plurality of metal regions so as to form a gap at least between said two adjacent metal regions.

11. The method of claim 10, wherein selectively forming said conductive cap layer on said top surface of each of said plurality of metal regions comprises selectively formed said conductive cap layer prior to removing said sacrificial material.

12. The method of claim 10, wherein selectively forming said conductive cap layer on said top surface of each of said plurality of metal regions comprises selectively forming said conductive cap layer after removing said sacrificial material.

13. The method of claim 10, wherein at least one of said dielectric material and said sacrificial material has a dielectric constant of approximately 3.0 or higher.

14. The method of claim 10, wherein said sacrificial material is formed so as to be comprised of carbon.

15. The method of claim 10, further comprising forming a second via opening in said dielectric cap layer so as to connect to one of said two adjacent metal regions and forming a second sacrificial material above said dielectric cap layer and said second via opening.

16. The method of claim 15, wherein forming said second via opening comprises controlling a degree of tapering of the bottom of said second via opening so as to reduce a probability of misaligning.

* * * * *